(12) United States Patent
Cheng

(10) Patent No.: US 10,879,132 B2
(45) Date of Patent: Dec. 29, 2020

(54) COMBINATION OF TENSILELY STRAINED N-TYPE FIN FIELD EFFECT TRANSISTORS AND COMPRESSIVELY STRAINED P-TYPE FIN FIELD EFFECT TRANSISTORS

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/424,790

(22) Filed: May 29, 2019

(65) Prior Publication Data

US 2020/0381308 A1 Dec. 3, 2020

(51) Int. Cl.
*H01L 21/8238* (2006.01)
*H01L 29/165* (2006.01)
(Continued)

(52) U.S. Cl.
CPC ........... *H01L 21/823821* (2013.01); *H01L 21/02532* (2013.01); *H01L 21/823828* (2013.01); *H01L 27/0924* (2013.01); *H01L 29/165* (2013.01); *H01L 29/66795* (2013.01); *H01L 29/785* (2013.01)

(58) Field of Classification Search
CPC ..... H01L 21/823821; H01L 21/823828; H01L 21/823487; H01L 21/823431; H01L 27/0886; H01L 29/785; H01L 29/78642; H01L 29/66795
See application file for complete search history.

(56) References Cited

U.S. PATENT DOCUMENTS 9,431,539 B2  8/2016 Qi et al.
9,589,849 B2  3/2017 Jacob et al.
(Continued)

OTHER PUBLICATIONS

Cheng et al., "High Performance Extremely Thin SOI(ETSOI) Hybrid CMOS with Si Channel NFET and Strained SiGe Channel PFET", 2012 International Electron Devices Meeting, Dec. 2012, 4 pages.

*Primary Examiner* — Hsien Ming Lee
(74) *Attorney, Agent, or Firm* — Tutunjian & Bitetto, P.C.; Randall Bluestone

(57) ABSTRACT

A method of forming tensilely strained n-type fin field effect transistors and compressively strained p-type fin field effect transistors on the same substrate is provided. The method includes forming a pair of adjacent semiconductor mandrels on a semiconductor etch-stop layer, and forming a fill layer on the adjacent semiconductor mandrels and semiconductor etch-stop layer. The method further includes removing a portion of the fill layer to expose one of the adjacent mandrels, and forming a fin on each of the sidewalls of the pair of adjacent semiconductor mandrels. The method further includes forming an occlusion layer on the fins and one of the pair of semiconductor mandrels, and removing another portion of the fill layer to expose the other of the pair of adjacent semiconductor mandrels. The method further includes forming another fin on each of the sidewalls of the other of the pair of adjacent semiconductor mandrels.

20 Claims, 9 Drawing Sheets

(51) Int. Cl.
*H01L 29/78* (2006.01)
*H01L 21/02* (2006.01)
*H01L 27/092* (2006.01)
*H01L 29/66* (2006.01)

(56) References Cited

U.S. PATENT DOCUMENTS

| | | |
|---|---|---|
| 9,679,899 B2 | 6/2017 | Loubet et al. |
| 9,853,056 B1 | 12/2017 | Cheng et al. |
| 9,905,649 B2 | 2/2018 | Balakrishnan et al. |
| 9,941,355 B1 | 4/2018 | Bedell et al. |
| 9,947,663 B2 | 4/2018 | Basker et al. |
| 2011/0027978 A1* | 2/2011 | Hargrove .......... H01L 21/26586 438/585 |
| 2016/0104799 A1 | 4/2016 | Qi et al. |
| 2018/0053853 A1 | 2/2018 | Cheng et al. |
| 2018/0315664 A1 | 11/2018 | Cheng et al. |

* cited by examiner

COMBINATION OF TENSILELY STRAINED N-TYPE FIN FIELD EFFECT TRANSISTORS AND COMPRESSIVELY STRAINED P-TYPE FIN FIELD EFFECT TRANSISTORS

BACKGROUND

The present invention generally relates to fin field effect transistors, and more particularly to n-type fin field effect transistors and p-type fin field effect transistors for complementary metal-oxide-semiconductor (CMOS) devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming tensilely strained n-type fin field effect transistors and compressively strained p-type fin field effect transistors on the same substrate is provided. The method includes forming a pair of adjacent semiconductor mandrels on a semiconductor etch-stop layer, and forming a fill layer on the pair of adjacent semiconductor mandrels and semiconductor etch-stop layer. The method further includes removing a portion of the fill layer to expose one of the pair of adjacent semiconductor mandrels, and forming a fin on each of the sidewalls of the one of the pair of adjacent semiconductor mandrels. The method further includes forming an occlusion layer on the fins and one of the pair of adjacent semiconductor mandrels, and removing another portion of the fill layer to expose the other of the pair of adjacent semiconductor mandrels. The method further includes forming another fin on each of the sidewalls of the other of the pair of adjacent semiconductor mandrels.

In accordance with another embodiment of the present invention, a method of forming tensilely strained n-type fin field effect transistors and compressively strained p-type fin field effect transistors on the same substrate is provided. The method includes forming a semiconductor etch-stop layer on the substrate, and forming a pair of adjacent semiconductor mandrels each on a semiconductor buffer mesa on the semiconductor etch-stop layer. The method further includes recessing the semiconductor buffer mesa beneath each of the semiconductor mandrels to form a semiconductor buffer pillar beneath each of the semiconductor mandrels, and forming a fill layer on the pair of adjacent semiconductor mandrels and semiconductor etch-stop layer. The method further includes removing a portion of the fill layer to expose one of the pair of adjacent semiconductor mandrels, and forming a fin on each of the sidewalls of the one of the pair of adjacent semiconductor mandrels. The method further includes forming an occlusion layer on the fins and the one of the pair of adjacent semiconductor mandrels, and removing another portion of the fill layer to expose the other of the pair of adjacent semiconductor mandrels. The method further includes forming another fin on each of the sidewalls of the other of the pair of adjacent semiconductor mandrels.

In accordance with another embodiment of the present invention, a tensilely strained n-type fin field effect transistor and compressively strained p-type fin field effect transistor on the same substrate is provided. The field effect transistors include a semiconductor etch-stop layer on the substrate, and at least four fins on the semiconductor etch-stop layer, wherein a dielectric pedestal is between each of the at least four fins and the semiconductor etch-stop layer, and wherein at least two of the at least four fins is tensilely strained and at least two of the at least four fins is compressively strained.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide tensilely strained n-type fin field effect transistors and compressively strained p-type fin field effect transistors for formation of complementary metal-oxide-semiconductor (CMOS) devices on the same substrate. Multiples of four adjacent fins can be formed, wherein two of the four fins are tensilely strained and two of the at least four fins are compressively strained.

Embodiments of the present invention provide a method of fabricating tensilely strained n-type fin field effect transistors and compressively strained p-type fin field effect transistors for formation of complementary metal-oxide-semiconductor (CMOS) devices on the same substrate using adjacent mandrels with a predetermined crystal lattice. Fins can be heteroepitaxially grown laterally from the sidewalls of the mandrels, where the fins can have a different lattice constant from the mandrel to provide tensile or compressive strain. Occlusion layers with a high Young's modulus can hold the fins in a tensilely or compressively strained state.

Exemplary applications/uses to which the present invention can be applied include, but are not limited to: memory devices (e.g., DRAM, SRAM) or logic devices (e.g., NAND gates, NOR gates, etc.) using CMOS.

It is to be understood that aspects of the present invention will be described in terms of a given illustrative architecture; however, other architectures, structures, substrate materials and process features and steps can be varied within the scope of aspects of the present invention.

Figure 1:
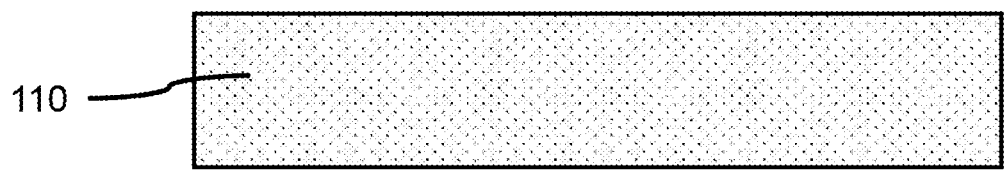
FIG. 1 is a cross-sectional side view showing a substrate, in accordance with an embodiment of the present invention.

Referring now to the drawings in which like numerals represent the same or similar elements and initially to FIG. 1, a substrate is shown, in accordance with an embodiment of the present invention.

In one or more embodiments, a substrate 110 can be a semiconductor wafer or a semiconductor-on-insulator (SeOI) wafer, for example, a silicon-on-insulator (SOI) wafer.

In various embodiments, the substrate 110 can a semiconductor, including, but not limited to, silicon (Si), silicon-germanium (SiGe), silicon carbide (SiC), or germanium (Ge), where a surface of the semiconductor can be exposed. The substrate 110 can a single crystal semiconductor, where the expose surface can provide a surface for epitaxial or heteroepitaxial growth of other semiconductor materials.

Figure 2:
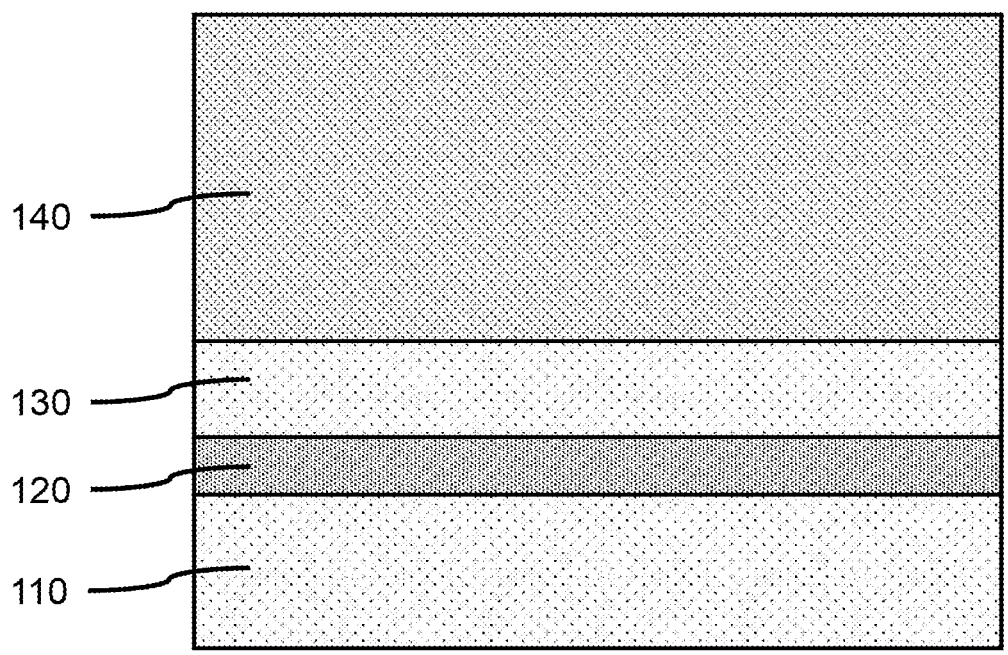
FIG. 2 is a cross-sectional side view showing a semiconductor etch-stop layer formed on the substrate, a semiconductor buffer layer formed on the semiconductor etch-stop layer, and a semiconductor mandrel layer formed on the semiconductor buffer layer, in accordance with an embodiment of the present invention.

FIG. 2 is a cross-sectional side view showing a semiconductor etch-stop layer formed on the substrate, a semiconductor buffer layer formed on the semiconductor etch-stop layer, and a semiconductor mandrel layer formed on the semiconductor buffer layer, in accordance with an embodiment of the present invention.

In one or more embodiments, a semiconductor etch-stop layer 120 can be formed on the substrate 110, where the semiconductor etch-stop layer 120 can be formed on the exposed surface of the substrate by epitaxial or heteroepitaxial growth.

In various embodiments, the semiconductor etch-stop layer 120 can be silicon (Si), silicon-germanium (SiGe), silicon carbide (SiC), or germanium (Ge), where the semiconductor etch-stop layer 120 is a different semiconductor material from the substrate 110 to provide etch selectivity between the semiconductor etch-stop layer 120 and substrate 110.

In various embodiments, the semiconductor etch-stop layer 120 can have a thickness in a range of about 3 nanometers (nm) to about 10 nm, or about 4 nm to about 6 nm, although other thicknesses are contemplated, where the thickness of the semiconductor etch-stop layer 120 is sufficient to provide an etch-stop for subsequently performed etching processes.

In one or more embodiments, a semiconductor buffer layer 130 can be formed on the semiconductor etch-stop layer 120, where the semiconductor buffer layer 130 can be formed on the semiconductor etch-stop layer 120 by epitaxial or heteroepitaxial growth.

In various embodiments, the semiconductor buffer layer 130 can be silicon (Si), silicon-germanium (SiGe), silicon carbide (SiC), or germanium (Ge), where the semiconductor buffer layer 130 is a different semiconductor material from the semiconductor etch-stop layer 120 to provide etch selectivity.

In various embodiments, the semiconductor buffer layer 130 can have a thickness in a range of about 15 nanometers (nm) to about 40 nm, or about 20 nm to about 30 nm, although other thicknesses are contemplated, where the thickness of the semiconductor buffer layer 130 is sufficient to avoid penetration of a subsequently performed etching process through the semiconductor buffer layer 130 to the semiconductor etch-stop layer 120. The thickness of the semiconductor buffer layer 130 can also determine the thickness of subsequently formed dielectric pedestals and spacer layer.

In one or more embodiments, a semiconductor mandrel layer 140 can be formed on the semiconductor buffer layer 130, where the semiconductor mandrel layer 140 can be formed on the semiconductor buffer layer 130 by epitaxial or heteroepitaxial growth.

In various embodiments, the semiconductor mandrel layer 140 can be silicon (Si), silicon-germanium (SiGe), silicon carbide (SiC), or germanium (Ge), where the semiconductor mandrel layer 140 can be a different semiconductor material from the semiconductor buffer layer 130 to provide etch selectivity. The semiconductor mandrel layer 140 and semiconductor etch-stop layer 120 can be made of the same material. In various embodiments, both the semiconductor etch-stop layer 120 and the semiconductor mandrel layer 140 can be silicon-germanium (SiGe) with the same or different germanium concentrations.

In various embodiments, the semiconductor mandrel layer 140 can have a thickness in a range of about 20 nm to about 60 nm, or about 30 nm to about 50 nm, or about 35 nm to about 45 nm, although other thicknesses are contemplated, where the thickness of the semiconductor mandrel layer 140 can determine the heights of subsequently formed fins.

In various embodiments, the semiconductor mandrel layer 140 can be silicon-germanium (SiGe) with a germanium concentration in a range of about 10 atomic percent (at. %) to about 60 at. %, or about 15 at. % to about 50 at. %, or about 20 at. % to about 30 at. %, although other concentrations are contemplated.

In a non-limiting exemplary embodiment, the semiconductor mandrel layer 140 can be silicon-germanium (SiGe) with a germanium concentration of about 20 atomic percent (at. %), and the semiconductor etch-stop layer 120 can be silicon-germanium (SiGe) with about 40 at. % Ge. The semiconductor buffer layer 130 can be single crystal silicon (Si) and the substrate can be single crystal silicon (Si), where the layers can be formed by heteroepitaxy.

When a material epitaxially grows on an underlying substrate with different crystalline lattice constants, the epitaxially grown layer attempts to match the lattice of the underlying substrate. As a result, the epitaxy layer can be strained. The strain polarity and amount of strain depend on lattice constant difference between the substrate and the epitaxy layer. For example, when SiGe is especially grown on a silicon substrate, the epitaxy SiGe layer is compressively strained along the epitaxy plane because fully relaxed SiGe has a larger lattice constant than fully relaxed silicon.

Figure 3:
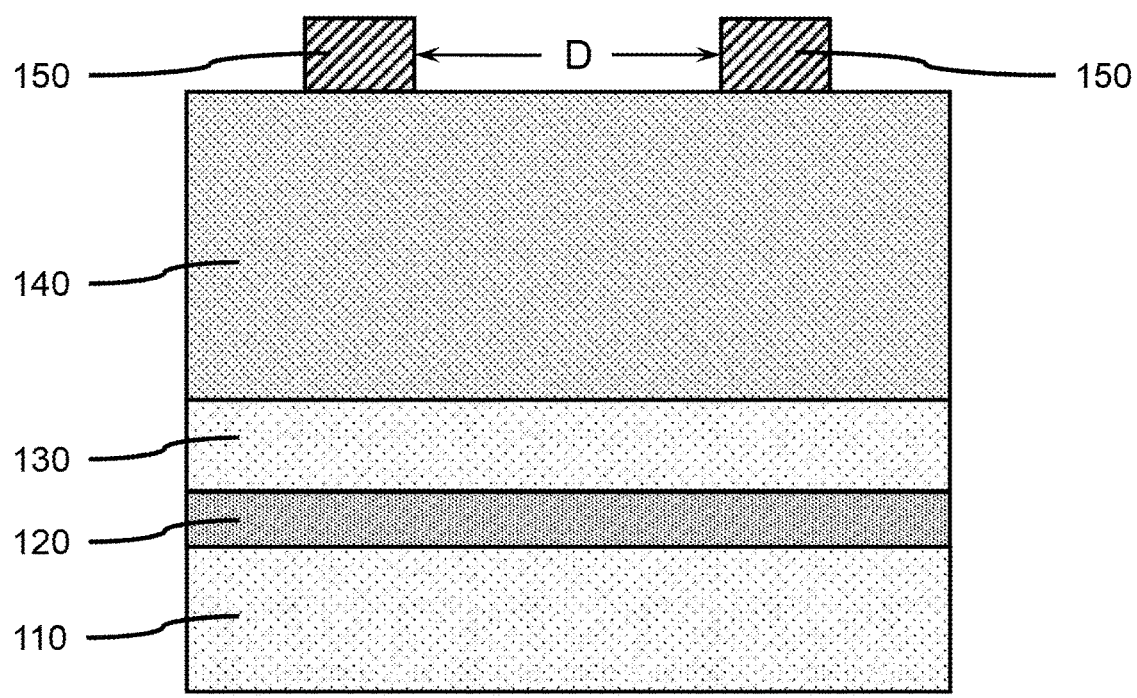
FIG. 3 is a cross-sectional side view showing mandrel templates formed on the semiconductor mandrel layer, in accordance with an embodiment of the present invention.

FIG. 3 is a cross-sectional side view showing mandrel templates formed on the semiconductor mandrel layer, in accordance with an embodiment of the present invention.

In one or more embodiments, one or more mandrel template(s) 150 can be formed on the semiconductor mandrel layer 140, where the mandrel template(s) 150 can be formed by patterning and etching a mandrel template layer using lithographic and etching methods.

In various embodiments, the mandrel template(s) 150 can be a dielectric hardmask material including, but not limited to, silicon oxide (SiO), silicon nitride (SiN), silicon oxynitride (SiON), silicon boronitride (SiBN), silicon carbonitride (SiCN), silicon boro carbonitride (SiBCN), or a combination thereof.

In various embodiments, the mandrel template(s) 150 can have a width in a range of about 20 nm to about 40 nm, or about 25 nm to about 35 nm, although other widths are contemplated, where the width are sufficient to provide spacing between subsequently formed fins to allow etching and other processing between the fins.

In various embodiments, two adjacent mandrel templates 150 can be separated by a distance, D, in a range of about 30 nm to about 80 nm, or about 40 nm to about 60 nm, although other distances are also contemplated.

Figure 4:
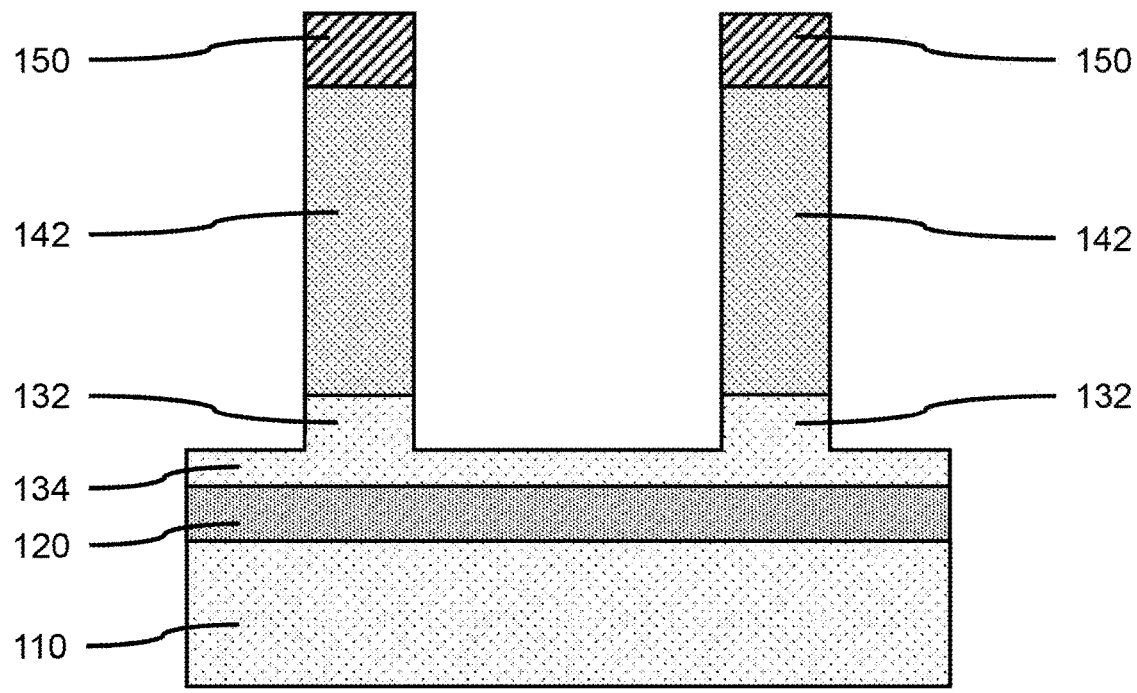
FIG. 4 is a cross-sectional side view showing a portion of the semiconductor mandrel layer and a portion of the semiconductor buffer layer removed to form a plurality of semiconductor mandrels and semiconductor buffer mesas on a semiconductor buffer spacer layer, in accordance with an embodiment of the present invention.

FIG. 4 is a cross-sectional side view showing a portion of the semiconductor mandrel layer and a portion of the semiconductor buffer layer removed to form a plurality of semiconductor mandrels and semiconductor buffer mesas on a semiconductor buffer spacer layer, in accordance with an embodiment of the present invention.

In one or more embodiments, a portion of the semiconductor mandrel layer 140 expose by the mandrel template(s) 150 can be removed, where the semiconductor mandrel layer 140 can be removed using a timed, non-selective reactive ion etch (RIE) to form one or more semiconductor mandrels 142. The portions of the semiconductor mandrel layer 140 removed can expose the underlying semiconductor buffer layer 130, and portions of the underlying semiconductor buffer layer 130 can be removed by the timed, non-selective or low selective (selectivity less than 2:1) reactive ion etch (RIE), which can vary. The thickness of the semiconductor buffer layer 130 can prevent the timed, non-selective or low selective RIE from reaching the semiconductor etch-stop layer 120. In various embodiments, the timed, non-selective or low selective RIE can form a semiconductor buffer mesa 132 beneath each of the one or more semiconductor mandrels 142 due to the over-etching of the semiconductor mandrel layer 140, while leaving a semiconductor buffer spacer layer 134 covering the semiconductor etch-stop layer 120. The semiconductor buffer spacer layer 134 can have varying thicknesses due to the timed RIE.

Figure 5:
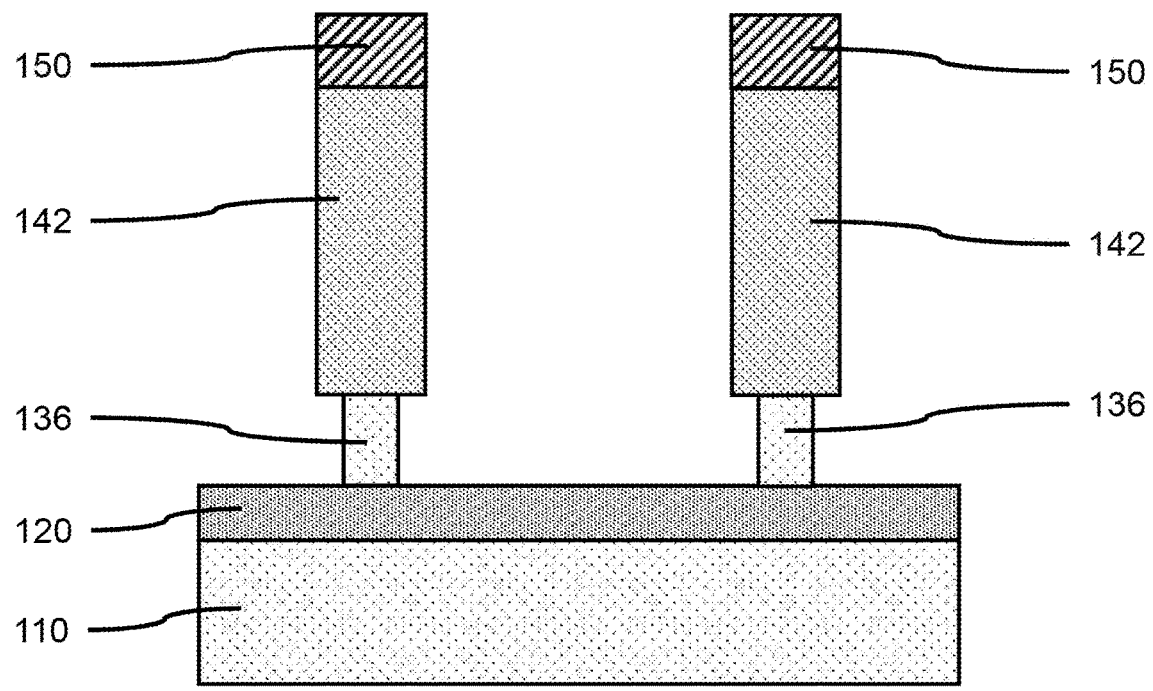
FIG. 5 is a cross-sectional side view showing the semiconductor buffer spacer layer removed to expose the semiconductor etch-stop layer, and the semiconductor buffer mesas recessed to form semiconductor buffer pillars, in accordance with an embodiment of the present invention.

FIG. 5 is a cross-sectional side view showing the semiconductor buffer spacer layer removed to expose the semiconductor etch-stop layer, and the semiconductor buffer mesas recessed to form semiconductor buffer pillars, in accordance with an embodiment of the present invention.

In one or more embodiments, the semiconductor buffer spacer layer 134 can be removed to expose the semiconductor etch-stop layer 120, and the semiconductor buffer mesas 132 can be recessed to form semiconductor buffer pillars 136 having a width less than the width of the overlying semiconductor mandrel 142. The semiconductor buffer spacer layer 134 can be removed and the semiconductor buffer mesas 132 can be recessed using a selective isotropic etch, for example, a wet chemical etch or dry plasma etch. The semiconductor etch-stop layer 120 can prevent the selective isotropic etch from reaching the substrate 110.

In various embodiments, the semiconductor buffer pillars 136 can have a width in a range of about 5 nm to about 15 nm, or about 8 nm to about 12 nm, although other widths are contemplated. The widths of the semiconductor buffer pillars 136 can be less than the semiconductor mandrels 142.

In a non-limiting exemplary embodiments, the semiconductor buffer pillars 136 can be single crystal silicon and the semiconductor mandrel 142 can be single crystal silicon-germanium (SiGe) with about a 20 atomic percent (at. %) germanium concentration, where the semiconductor mandrel 142 is in a relaxed state due to elastic edge strain relaxation. By recessing the semiconductor buffer mesas 132 and undercutting the semiconductor mandrel 142, a substantial bottom portion of the semiconductor mandrel 142 is exposed. The original strain in the semiconductor mandrel layer as grown becomes substantially relaxed due to the exposed free surfaces, since the material surface is no longer held in place by a material with a different lattice constant.

Figure 6:
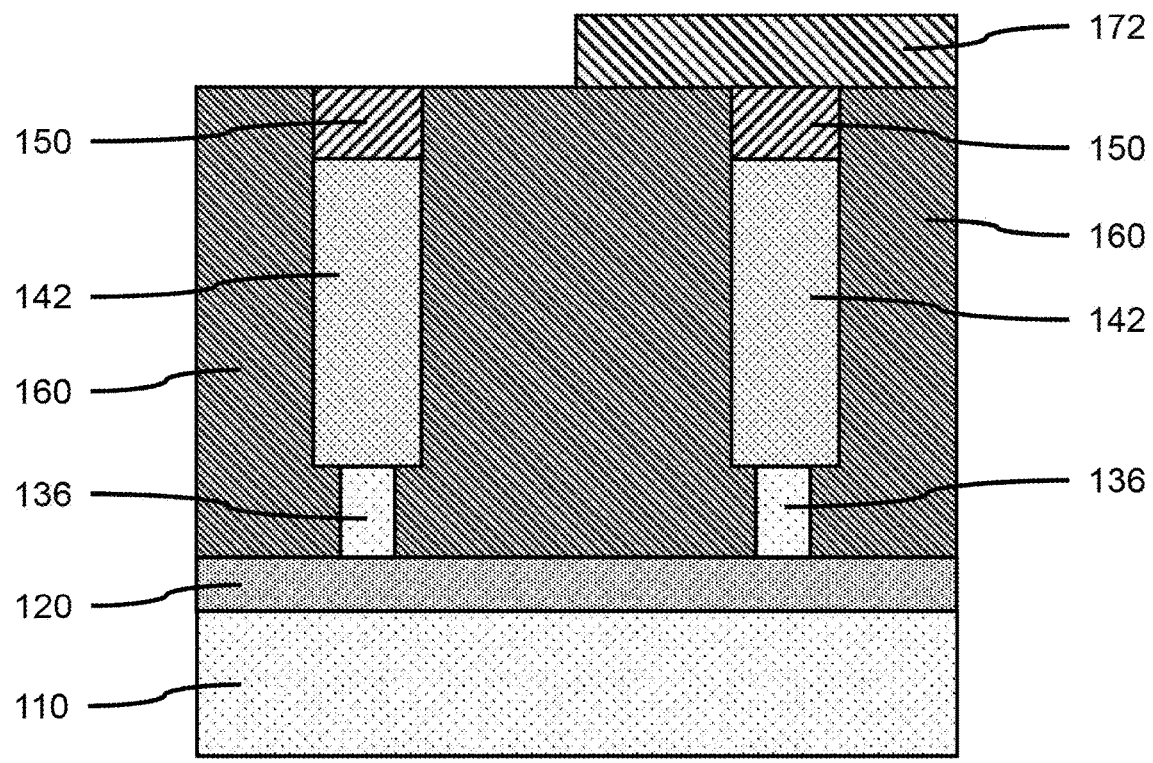
FIG. 6 is a cross-sectional side view showing a fill layer formed on the semiconductor etch-stop layer, semiconductor buffer pillars, and semiconductor mandrels, and a block template formed on the fill layer, in accordance with an embodiment of the present invention.

FIG. 6 is a cross-sectional side view showing a fill layer formed on the semiconductor etch-stop layer, semiconductor buffer pillars, and semiconductor mandrels, and a block template formed on the fill layer, in accordance with an embodiment of the present invention.

In one or more embodiments, a fill layer 160 can be formed on the semiconductor etch-stop layer 120, semiconductor buffer pillars 136, and semiconductor mandrels 142, where the fill layer 160 can be formed by a conformal deposition, for example, atomic layer deposition (ALD), plasma enhanced ALD (PEALD), or a combination of a conformal deposition and blanket deposition, for example, chemical vapor deposition (CVD), plasma enhanced CVD (PECVD), that fills in the spaces around the semiconductor buffer pillars 136 overhung by the semiconductor mandrels 142. Excess fill layer material can be removed using a chemical-mechanical polishing (CMP) that exposes the top surface of the mandrel template(s) 150.

In various embodiments, the fill layer 160 can be a dielectric material, including, but not limited to, silicon nitride (SiN), silicon boro carbonitride (SiBCN), amorphous diamond, boron nitride (BN), or a combination thereof. The fill layer 160 can anchor the relaxed semiconductor mandrels 142 in a relaxed state, where the fill layer can be a rigid material having a young's modulus of at least 200 Gigapascal (GPa).

In one or more embodiments, one or more block template(s) 172 can be formed on the fill layer 160, where the block template(s) 172 can be formed by patterning and etching a block template layer using lithographic and etching methods.

In various embodiments, the block template(s) 172 can be a dielectric hardmask material including, but not limited to, silicon oxide (SiO), silicon nitride (SiN), silicon oxynitride (SiON), silicon boronitride (SiBN), silicon carbonitride (SiCN), silicon boro carbonitride (SiBCN), or a combination thereof. In various embodiments, the block template(s) 172 can be amorphous silicon (a-Si), an organic polymer, a metallic material (e.g., titanium nitride), as long as the block template(s) 172 can protect the underlying structure when etching the exposed fill layer 160.

Figure 7:
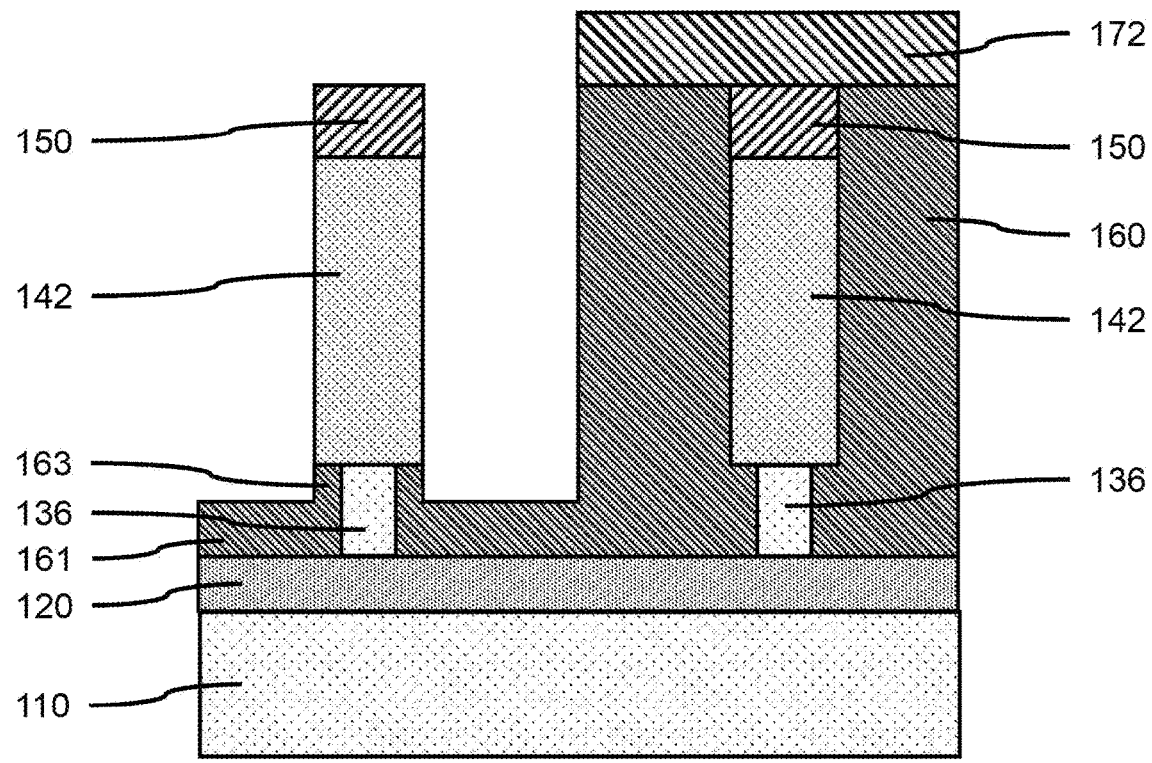
FIG. 7 is a cross-sectional side view showing a portion of the fill layer not covered by the block template removed to expose the sidewalls of the semiconductor mandrel, in accordance with an embodiment of the present invention.

FIG. 7 is a cross-sectional side view showing a portion of the fill layer not covered by the block template removed to expose the sidewalls of the semiconductor mandrel, in accordance with an embodiment of the present invention.

In one or more embodiments, a portion of the fill layer 160 not covered by the block template(s) 172 can be removed to expose the sidewalls of one or more semiconductor mandrel(s) 142, where the portion of the fill layer 160 can be removed using a selective directional etch (e.g., RIE). The height of the fill layer 160 can be reduced to expose the sidewalls of the semiconductor mandrel(s) 142 without exposing the semiconductor etch-stop layer 120 or semiconductor buffer pillars 136. A fill liner 161 can cover the semiconductor etch-stop layer 120, and inner spacers 163 can be formed by the overhanging semiconductor mandrel(s) 142, whereas the portion(s) of the fill layer 160 covered by the block template(s) 172 can remain.

Figure 8:
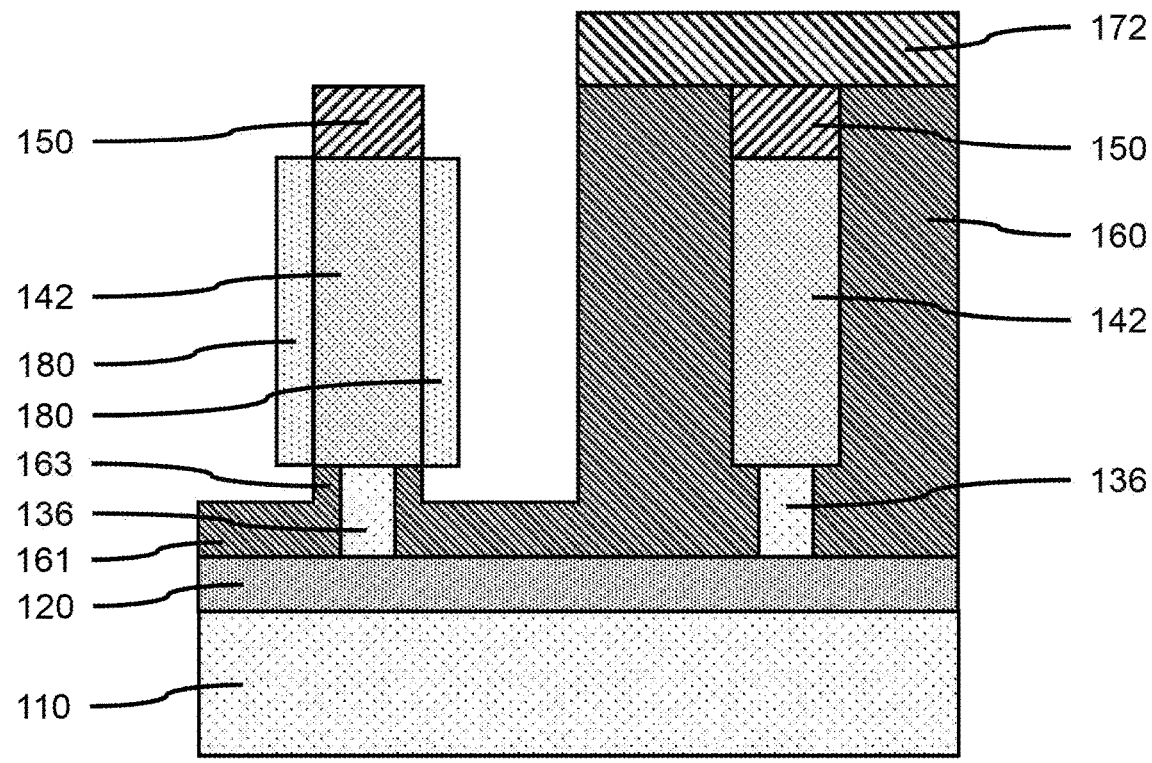
FIG. 8 is a cross-sectional side view showing fins formed on the exposed sidewalls of the exposed semiconductor mandrel, in accordance with an embodiment of the present invention.

FIG. 8 is a cross-sectional side view showing fins formed on the exposed sidewalls of the exposed semiconductor mandrel, in accordance with an embodiment of the present invention.

In one or more embodiments, the block template(s) 172 can be removed using a selective isotropic etch (e.g., wet chemical etch, dry plasma etch). Depending on the material used, the templates 172 can be removed before or after the formation of fins. If the templates 172 are dielectric, they can be removed either before or after the formation of the fins. If the templates 172 are organic polymers or metallic materials, they can be removed before fin formation to avoid complications of those materials during epitaxial or heteroepitaxial formation of fins.

In one or more embodiments, fins 180 can be formed on the exposed sidewalls of the exposed semiconductor mandrel 142, where the fins 180 can be formed by lateral heteroepitaxial growth. The fins 180 can be a semiconductor material different from the semiconductor material of the semiconductor mandrel 142, such that the fins 180 have a tensile or compressive strain due to a difference in the lattice constants of the two different materials.

In various embodiments, the fins 180 can have a width in a range of about 5 nm to about 12 nm, or about 6 nm to about 8 nm, although other widths are also contemplated. In various embodiments, the width of fins 180 can be less than the width of semiconductor mandrel 142, for example, by about 10 nm to about 30 nm.

In a non-limiting exemplary embodiment, silicon fins 180 can be heteroepitaxially grown on the sidewalls of substantially relaxed silicon-germanium (SiGe) semiconductor mandrels 142, where the difference in lattice constants between the silicon and silicon-germanium (SiGe) semiconductor mandrels 142 imparts a tensile strain to the silicon (Si) fins 180.

Figure 9:
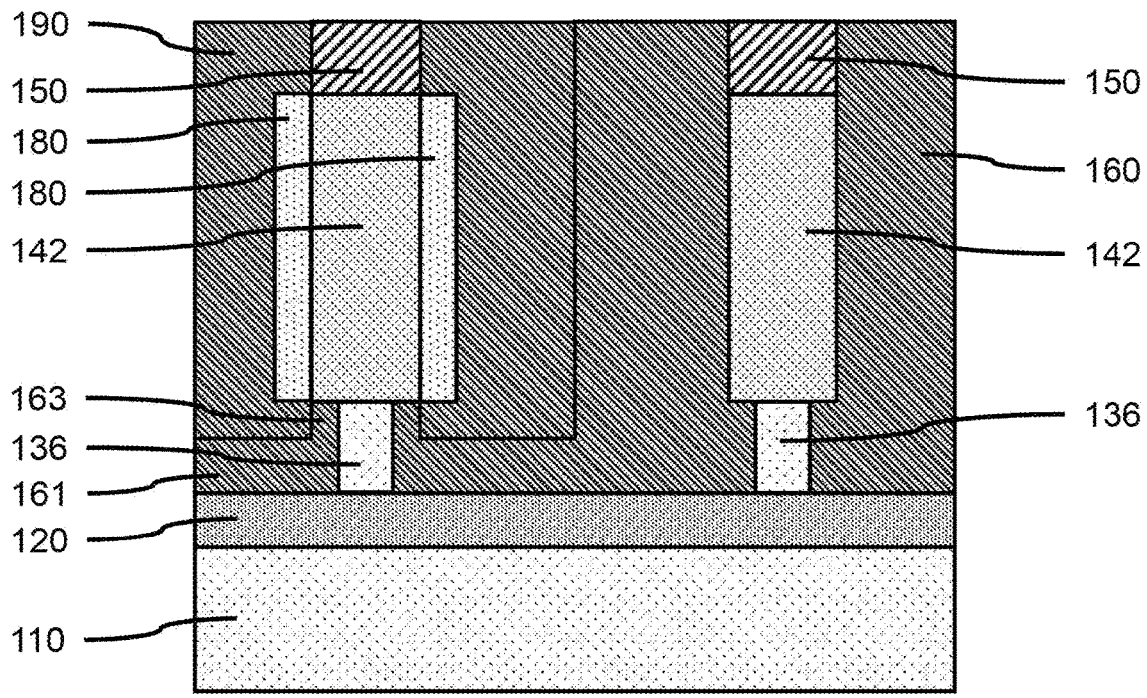
FIG. 9 is a cross-sectional side view showing an occlusion layer formed on the fins and fill layer, in accordance with an embodiment of the present invention.

FIG. 9 is a cross-sectional side view showing an occlusion layer formed on the fins and fill layer, in accordance with an embodiment of the present invention.

In one or more embodiments, an occlusion layer 190 can be formed on the fins 180, fill liner 161, and remaining fill layer 160, where the occlusion layer 190 can be formed by a conformal deposition (e.g., ALD, PEALD), or a combination of a conformal deposition and blanket deposition, (e.g., CVD, PECVD), that fills in the spaces overhung by the fins 180.

In various embodiments, the occlusion layer 190 can be a dielectric material, including, but not limited to, silicon nitride (SiN), silicon boro carbonitride (SiBCN), amorphous diamond, boron nitride (BN), or a combination thereof, where the occlusion layer 190 can be the same material as the fill layer 160.

In various embodiments, a CMP can be used to remove excess occlusion layer material and provide a smooth, flat surface coplanar with the fill layer and mandrel templates 150.

Figure 10:
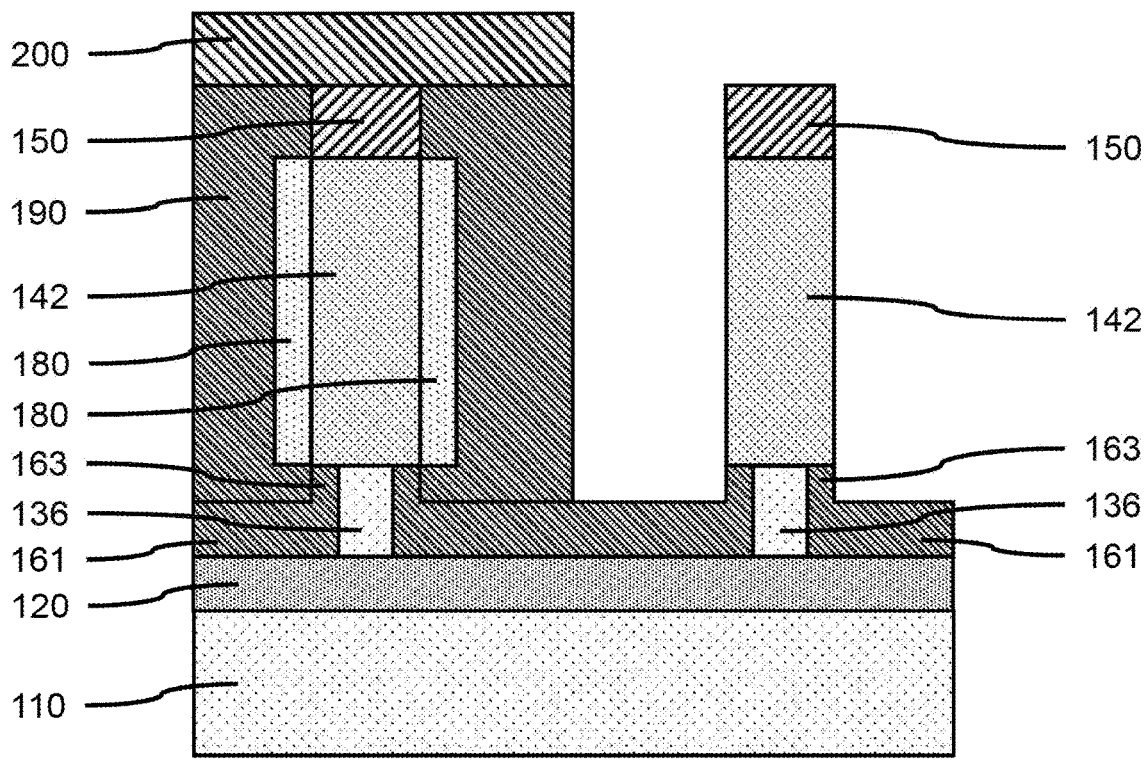
FIG. 10 is a cross-sectional side view showing a second block template formed on the occlusion layer, and a portion of the remaining fill layer not covered by the second block template removed to expose the sidewalls of a different semiconductor mandrel, in accordance with an embodiment of the present invention.

FIG. 10 is a cross-sectional side view showing a second block template formed on the occlusion layer, and a portion of the remaining fill layer not covered by the second block template removed to expose the sidewalls of a different semiconductor mandrel, in accordance with an embodiment of the present invention.

In one or more embodiments, second block template(s) 200 can be formed on the occlusion layer 190, where the second block template(s) 200 can be formed by patterning and etching a block template layer using lithographic and etching methods. The second block template(s) 200 can leave the remain portions of the fill layer 160 exposed.

In one or more embodiments, a portion of the remaining fill layer 160 not covered by the second block template(s) 200 can be removed to expose the sidewalls of one or more other semiconductor mandrel(s) 142, where the portion of the fill layer 160 can be removed using a selective directional etch (e.g., RIE). The height of the fill layer 160 can be reduced to expose the sidewalls of the semiconductor mandrel(s) 142 without fins 180, and without exposing the semiconductor etch-stop layer 120 or remaining semiconductor buffer pillars 136. A fill liner 161 can cover the semiconductor etch-stop layer 120, and inner spacers 163 can be formed by the overhanging semiconductor mandrel(s) 142, whereas the occlusion layer 190 covered by the second block template(s) 200 can remain.

Figure 11:
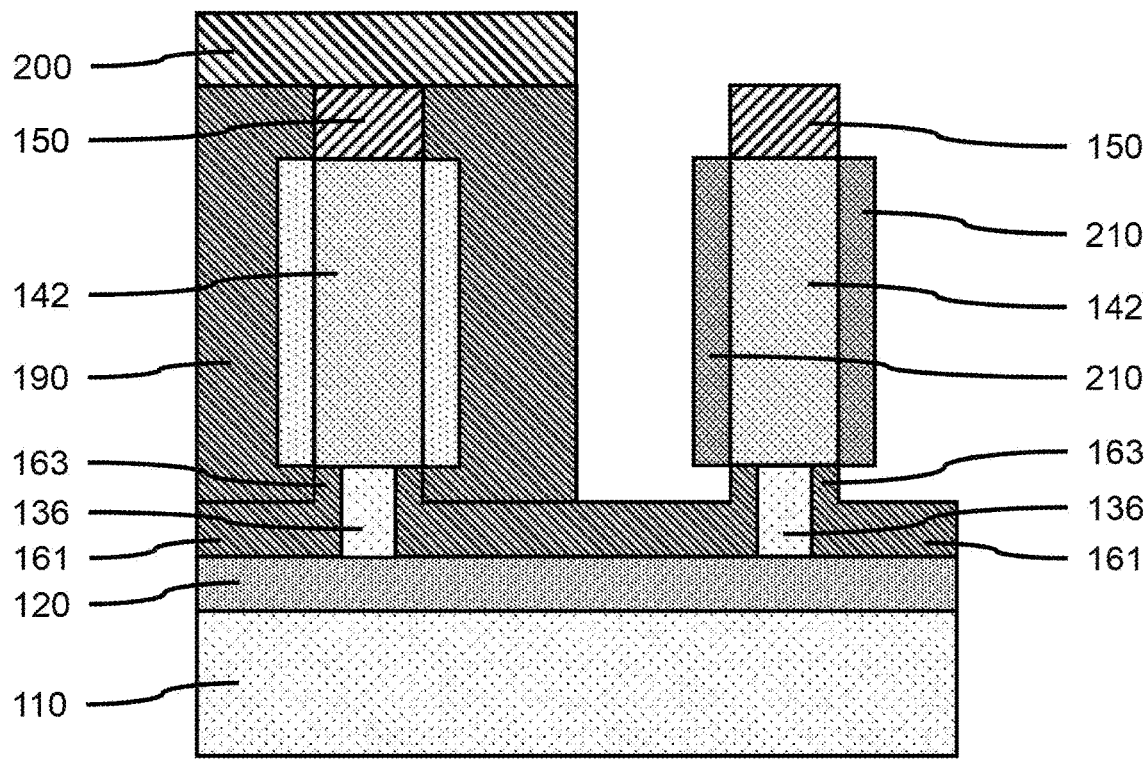
FIG. 11 is a cross-sectional side view showing fins formed on the exposed sidewalls of the exposed semiconductor mandrel, in accordance with an embodiment of the present invention.

FIG. 11 is a cross-sectional side view showing fins formed on the exposed sidewalls of the exposed semiconductor mandrel, in accordance with an embodiment of the present invention.

In one or more embodiments, the second block template(s) 200 can be removed using a selective isotropic etch (e.g., wet chemical etch, dry plasma etch).

In one or more embodiments, fins 210 can be formed on the exposed sidewalls of the exposed semiconductor mandrel 142, where the fins 210 can be formed by lateral heteroepitaxial growth. The fins 210 can be a semiconductor material different from the semiconductor material of the semiconductor mandrel 142, such that the fins 210 have a tensile or compressive strain due to a difference in the lattice constants of the two different materials. The fins 210 can have the opposite strain from the fins 180.

In various embodiments, the fins 210 can have a width in a range of about 5 nm to about 12 nm, or about 6 nm to about 8 nm, although other widths are also contemplated. In various embodiments, the width of fins 210 can be less than the width of semiconductor mandrel 142, for example, by about 10 nm to about 30 nm In a non-limiting exemplary embodiment, silicon-germanium fins 210 having a greater germanium concentration can be heteroepitaxially grown on the sidewalls of silicon-germanium (SiGe) semiconductor mandrels 142 having a lower germanium concentration, where the difference in lattice constants between the high-Ge silicon-germanium and low-Ge silicon-germanium (SiGe) semiconductor mandrels 142 imparts a compressive strain to the high-Ge silicon-germanium (SiGe) fins 180. The two compressively strained fins can be separated from the two tensilely strained fins by a distance in a range of about 30 nm to about 100 nm.

Figure 12:
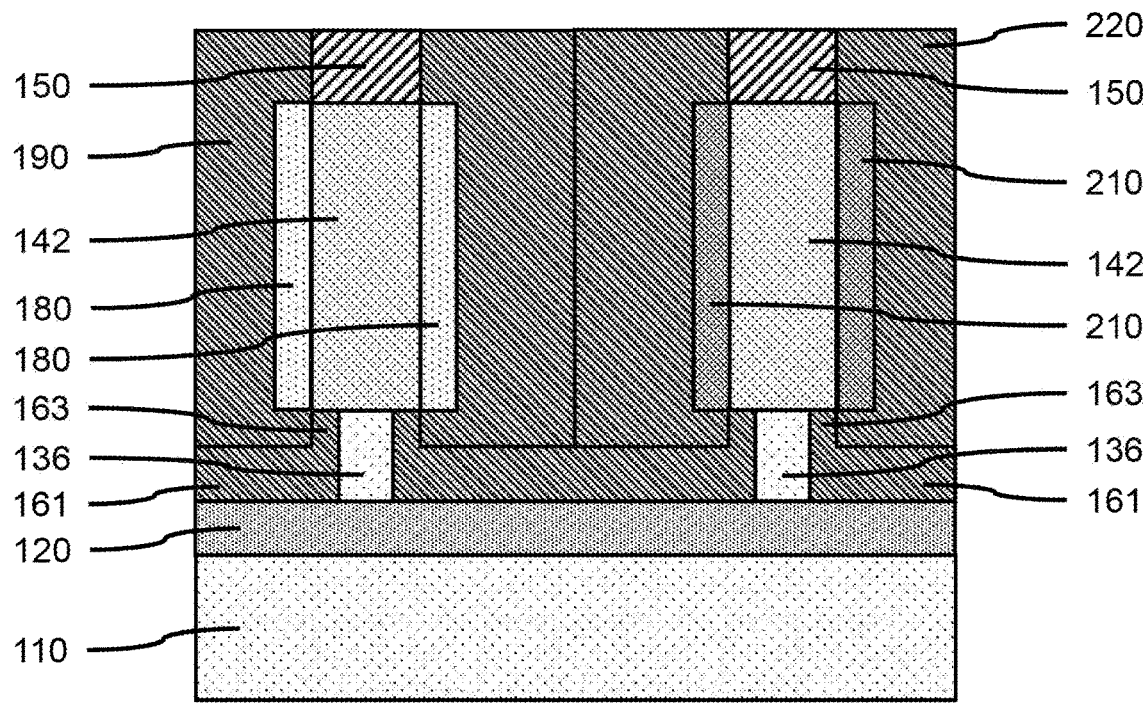
FIG. 12 is a cross-sectional side view showing a second occlusion layer formed on the exposed fins and remaining fill layer, in accordance with an embodiment of the present invention.

FIG. 12 is a cross-sectional side view showing a second occlusion layer formed on the exposed fins and remaining fill layer, in accordance with an embodiment of the present invention.

In one or more embodiments, a second occlusion layer 220 can be formed on the fins 210, fill liner 161, and occlusion layer 190, where the second occlusion layer 220 can be formed by a conformal deposition (e.g., ALD, PEALD), or a combination of a conformal deposition and blanket deposition, (e.g., CVD, PECVD), that fills in the spaces overhung by the fins 210.

In various embodiments, the second occlusion layer 220 can be a dielectric material, including, but not limited to, silicon nitride (SiN), silicon boro carbonitride (SiBCN), amorphous diamond, boron nitride (BN), or a combination thereof, where the second occlusion layer 220 can be the same material as the fill liner 161 and occlusion layer 190, or a different dielectric material.

In various embodiments, a CMP can be used to remove excess occlusion layer material and provide a smooth, flat surface coplanar with the fill layer and mandrel templates 150.

Figure 13:
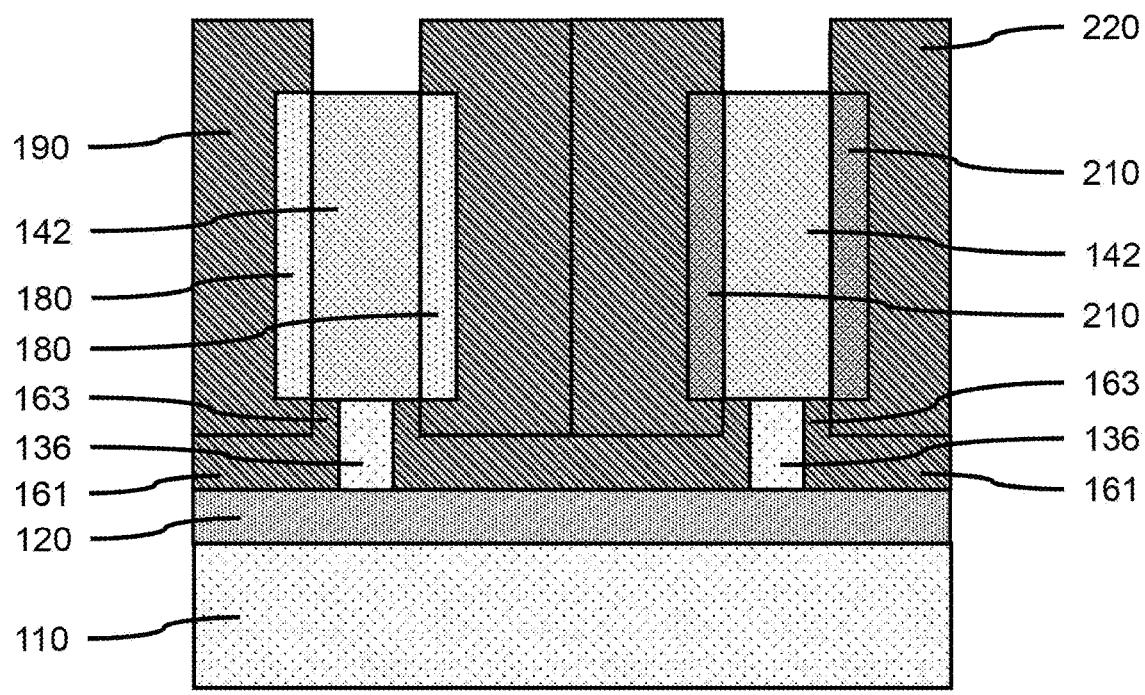
FIG. 13 is a cross-sectional side view showing the mandrel templates removed from the plurality of mandrels, in accordance with an embodiment of the present invention.

FIG. 13 is a cross-sectional side view showing the mandrel templates removed from the plurality of mandrels, in accordance with an embodiment of the present invention.

In one or more embodiments, the mandrel templates 150 can be removed from the plurality of semiconductor mandrels 142, where the mandrel templates 150 can be removed using a selective isotropic etch (e.g., wet chemical etch). Removal of the mandrel templates 150 can expose the semiconductor mandrels 142 between portions of the occlusion layer 190 or second occlusion layer 220.

Figure 14:
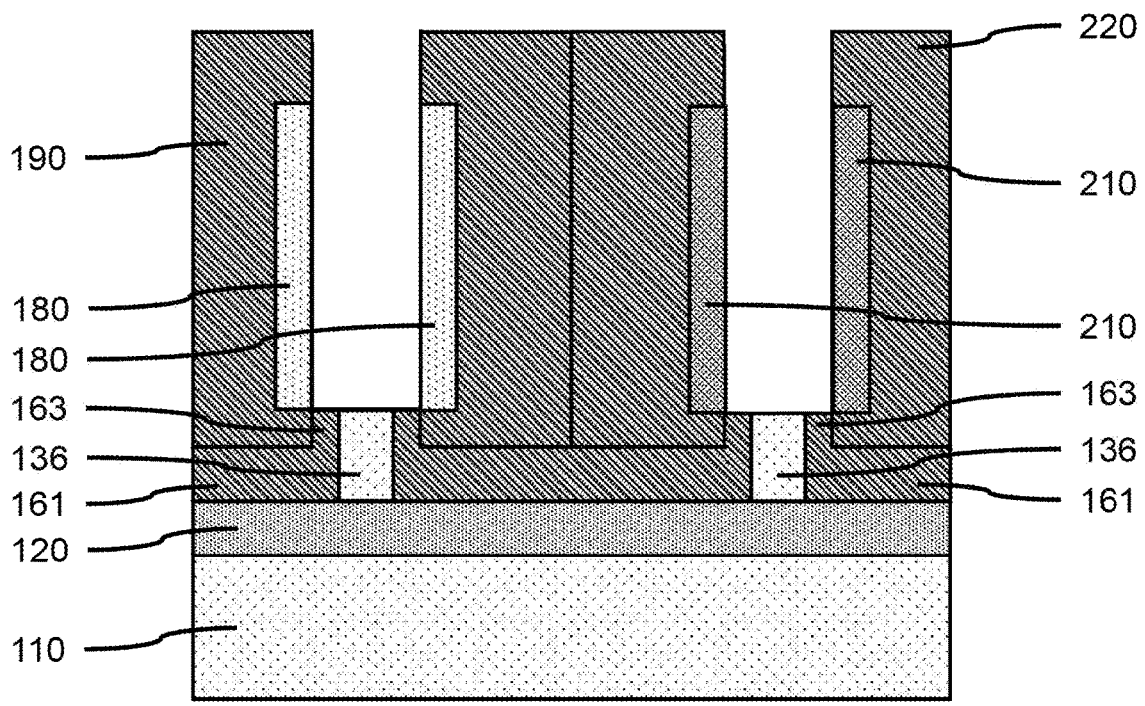
FIG. 14 is a cross-sectional side view showing the plurality of mandrels removed to expose sidewalls of the fins, in accordance with an embodiment of the present invention.

FIG. 14 is a cross-sectional side view showing the plurality of mandrels removed to expose sidewalls of the fins, in accordance with an embodiment of the present invention.

In one or more embodiments, the semiconductor mandrels 142 can be removed using a selective isotropic etch (e.g., wet chemical etch) leaving the fins 180 and fins 210 with the occlusion layer 190 or second occlusion layer 220. Removal of the semiconductor mandrels 142 can expose the semiconductor buffer pillars 136 and inner spacers 163.

Figure 15:
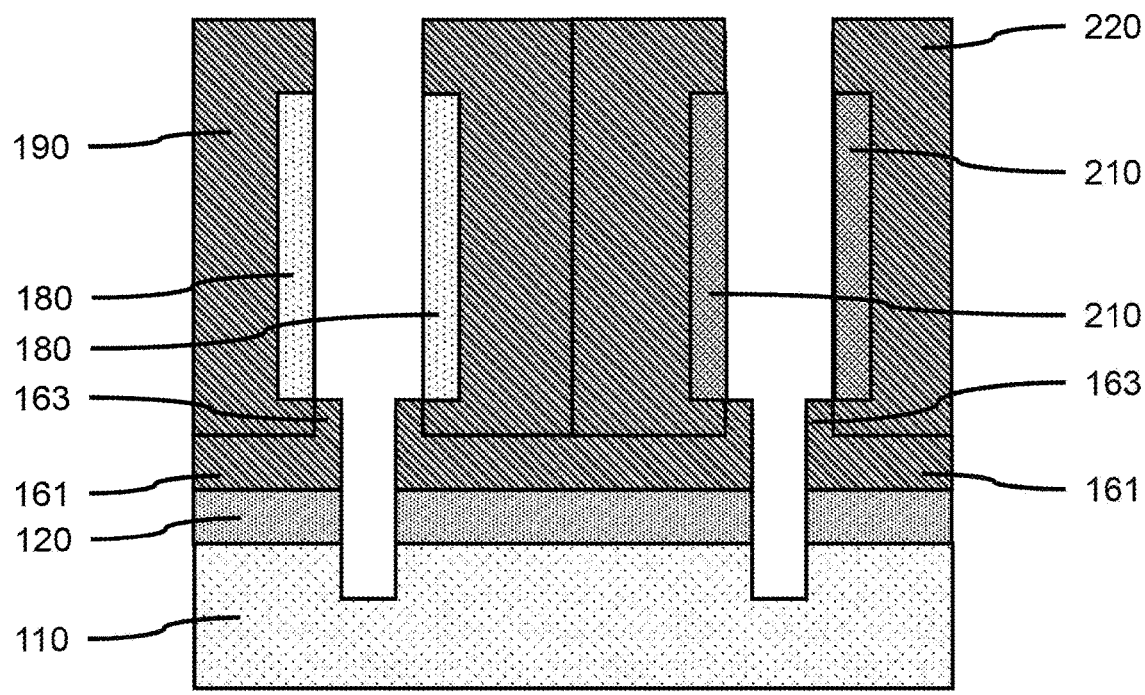
FIG. 15 is a cross-sectional side view showing the semiconductor buffer pillars removed and trenches formed through the semiconductor etch-stop layer into the substrate, in accordance with an embodiment of the present invention.

FIG. 15 is a cross-sectional side view showing the semiconductor buffer pillars removed and trenches formed through the semiconductor etch-stop layer into the substrate, in accordance with an embodiment of the present invention.

In one or more embodiments, the semiconductor buffer pillars 136 can be removed using a directional RIE process that exposes a portion of the semiconductor etch-stop layer 120, where the fins 180, 210 are protected by overhanging portions of occlusion layer 190 and occlusion layer 220.

In one or more embodiments, the exposed portion of the semiconductor etch-stop layer 120 and substrate 110 can be removed using an RIE, where the inner spacers 163 can form a mask that self-aligns the trench formed through the semiconductor etch-stop layer 120 into the substrate 110. The trench can extend into the substrate to form an isolation region. Alternatively, the SiGe mandrels, Si buffer layer, and the etch stop layer 120 can be etched together by directional RIE processing, while the fins are protected by occlusion layers 190 and 220.

Figure 16:
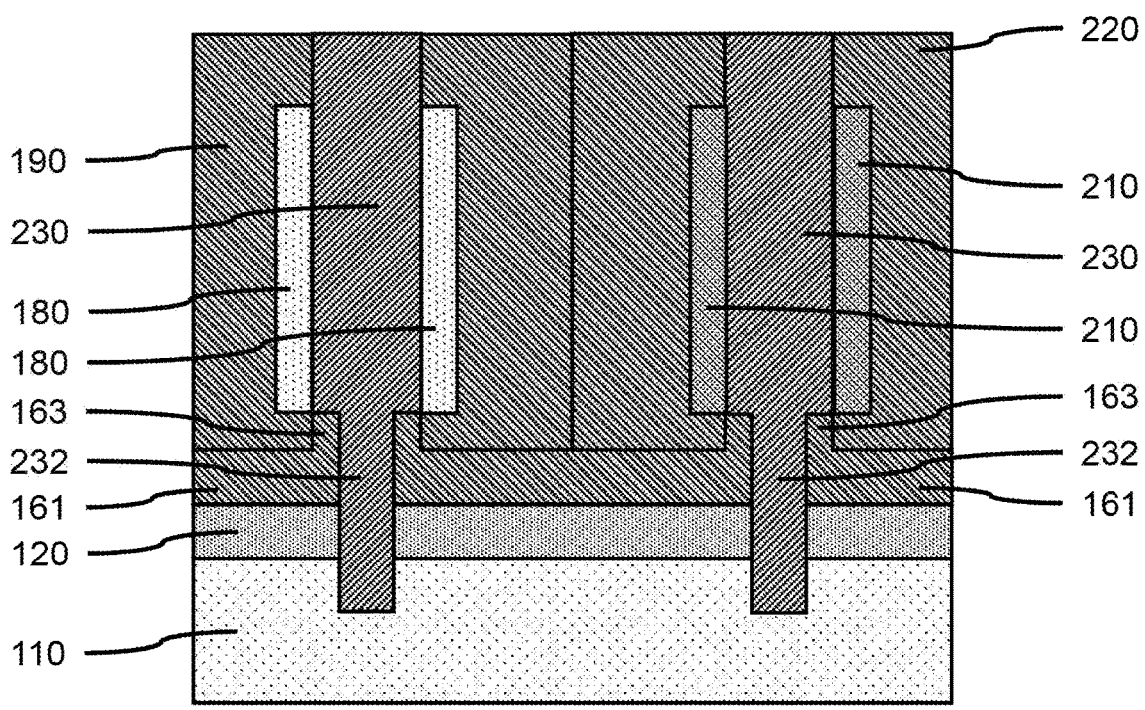
FIG. 16 is a cross-sectional side view showing dielectric plugs formed in the trenches and between the fins, in accordance with an embodiment of the present invention.

FIG. 16 is a cross-sectional side view showing dielectric plugs formed in the trenches and between the fins, in accordance with an embodiment of the present invention.

In one or more embodiments, dielectric plugs 230 can be formed in the trenches and between the fins 180 or fins 210. The dielectric plugs 230 can be formed by a conformal deposition, so the trenches and spacers between the fins do not pinch off. A portion of the dielectric plugs formed in the trenches can form shallow trench isolation regions 232 into the substrate 110.

In various embodiments, the dielectric plugs 230 can be a dielectric material, including, but not limited to, silicon oxide (SiO), silicon nitride (SiN), silicon boro carbonitride (SiBCN), amorphous diamond, silicon oxynitride (SiON), carbon-doped silicon oxide (SiOC), silicon-carbon-nitride (SiCN), boron nitride (BN), silicon boron nitride (SiBN), silicon oxycabonitride (SiOCN), and combinations thereof. The dielectric plugs 230 can be the same material as the fill liner 161, occlusion layer 190, and second occlusion layer 220, or a different dielectric material.

Figure 17:
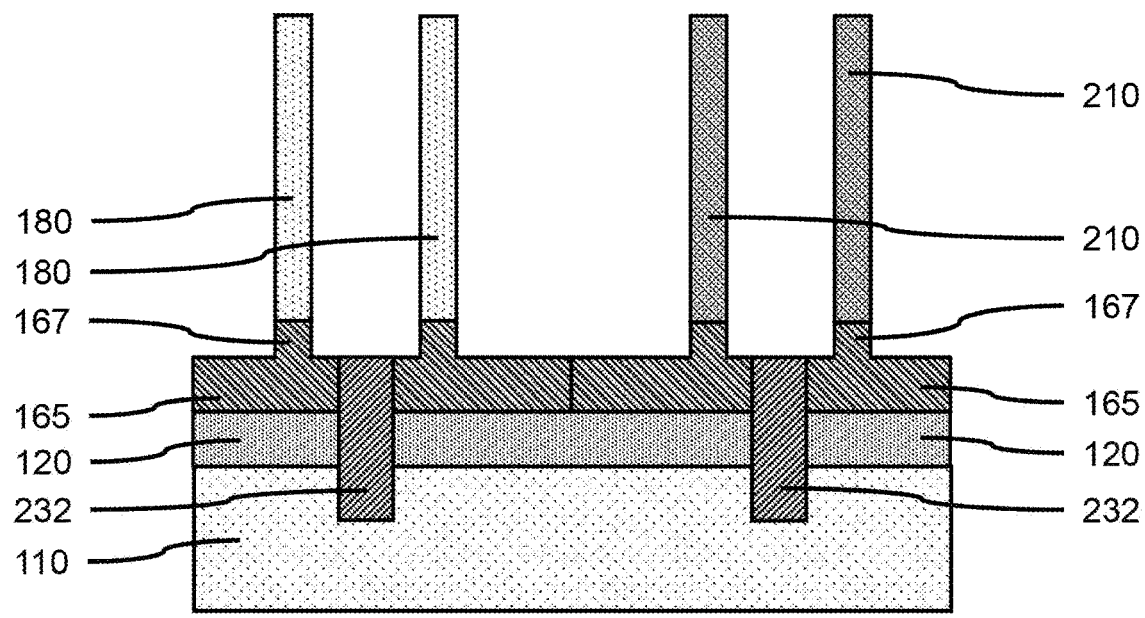
FIG. 17 is a cross-sectional side view showing the height of the dielectric plugs and occlusion layers reduced to expose the fins and form a pedestal beneath each of the fins, in accordance with an embodiment of the present invention.

FIG. 17 is a cross-sectional side view showing the height of the dielectric plugs and occlusion layers reduced to expose the fins and form a pedestal beneath each of the fins, in accordance with an embodiment of the present invention.

In one or more embodiments, the height of the dielectric plugs 230 and occlusion layers 190, 220 can be reduced to expose the fins 180, 210, and form a dielectric pedestal 167 and a dielectric spacer layer 165 beneath each of the fins. The height of the dielectric plugs 230 and occlusion layers 190, 220 can be reduced down to the shallow trench isolation regions 232, where the inner spacers 163 can be removed and the full height of the sidewalls of the fins are exposed.

Figure 18:
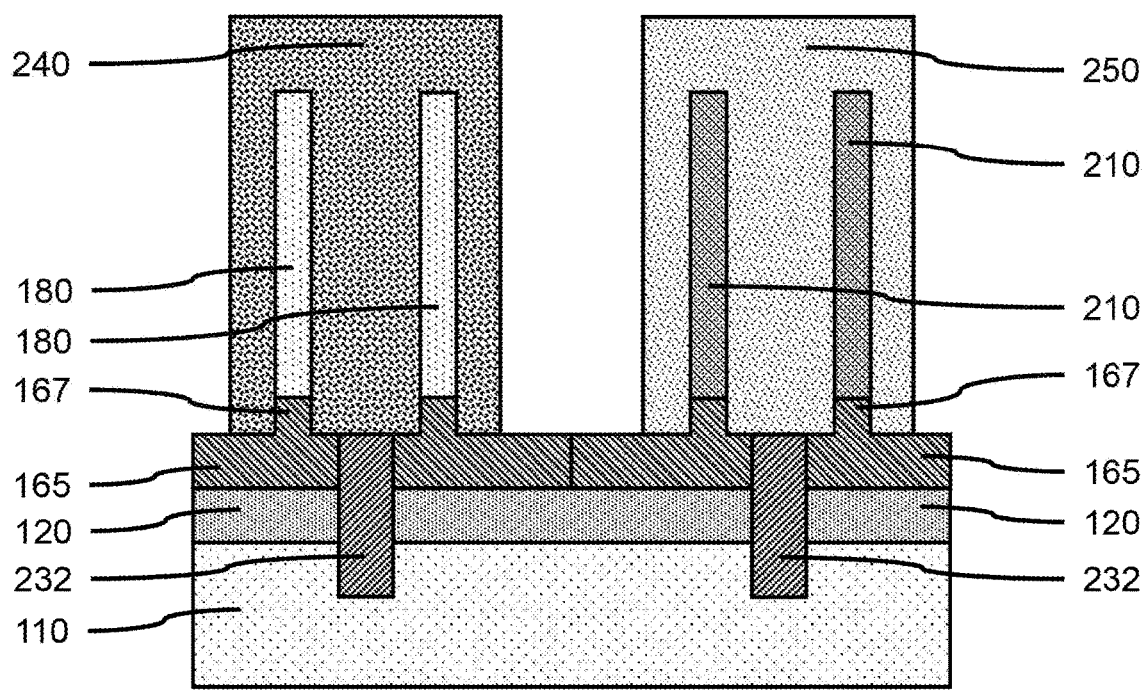
FIG. 18 is a cross-sectional side view showing separate gate structures formed on adjacent pairs of fins, in accordance with an embodiment of the present invention.

FIG. 18 is a cross-sectional side view showing separate gate structures formed on adjacent pairs of fins, in accordance with an embodiment of the present invention.

In one or more embodiments, gate structures 240, 250 can be formed on the fins 180, 210, where a gate structure can be formed on one or more n-type fins and another gate structure can be formed on one or more p-type fins adjacent to the gate structure on the n-type fins. The gate structures 240 and 250 can be electrically connected or isolated, depending on the circuit design.

The gate structures can include a gate dielectric layer formed on the fin and a conductive gate electrode formed on the gate dielectric layer. Gate spacer(s) can be formed on the gate structure. Source/drains can be formed on the fin 180, 210 on opposite sides of the gate structure and gate spacer, where the source/drains are suitably doped to form an n-type or a p-type device.

In various embodiments, an n-type device can be formed adjacent to a p-type device and electrically connected to form a CMOS device on the same region of the substrate 110.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates other rise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms ended to encompass different orientations of the device in use or operation addition A the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming tensilely strained n-type fin field effect transistors and compressively strained p-type fin field effect transistors on the same substrate, comprising:
   forming a pair of adjacent semiconductor mandrels on a semiconductor etch-stop layer;
   forming a fill layer on the pair of adjacent semiconductor mandrels and semiconductor etch-stop layer;
   removing a portion of the fill layer to expose one of the pair of adjacent semiconductor mandrels;
   forming a fin on each of the sidewalls of the one of the pair of adjacent semiconductor mandrels;
   forming an occlusion layer on the fins and one of the pair of adjacent semiconductor mandrels;
   removing another portion of the fill layer to expose the other of the pair of adjacent semiconductor mandrels; and
   forming another fin on each of the sidewalls of the other of the pair of adjacent semiconductor mandrels.

2. The method of claim 1, wherein each of the pair of adjacent semiconductor mandrels is made of silicon-germanium (SiGe).

3. The method of claim 2, wherein the each of the pair of adjacent silicon-germanium mandrels has a germanium concentration in a range of about 20 atomic percent (at. %) to about 40 at. %.

4. The method of claim 3, wherein the fin formed on the one of the pair of adjacent semiconductor mandrels is silicon (Si).

5. The method of claim 3, wherein the fin formed on the one of the pair of adjacent semiconductor mandrels is silicon-germanium (SiGe) having a greater germanium concentration than the silicon-germanium mandrels.

6. The method of claim 3, wherein the semiconductor etch-stop layer has a greater germanium concentration than the silicon-germanium mandrels.

7. The method of claim 6, wherein the semiconductor etch-stop layer has a germanium concentration in a range of about 20 atomic percent (at. %) to about 40 at. %.

8. The method of claim 6, wherein the fins on the one of the pair of adjacent semiconductor mandrels are tensilely strained, and the fins on the other of the pair of adjacent semiconductor mandrels are compressively strained.

9. The method of claim 6, wherein the fill layer is a material with a Young's modulus of at least 200 Gigapascals (GPa).

10. A method of forming tensilely strained n-type fin field effect transistors and compressively strained p-type fin field effect transistors on the same substrate, comprising:
    forming a semiconductor etch-stop layer on the substrate;
    forming a pair of adjacent semiconductor mandrels each on a semiconductor buffer mesa on the semiconductor etch-stop layer;
    recessing the semiconductor buffer mesa beneath each of the semiconductor mandrels to form a semiconductor buffer pillar beneath each of the semiconductor mandrels;
    forming a fill layer on the pair of adjacent semiconductor mandrels and semiconductor etch-stop layer;
    removing a portion of the fill layer to expose one of the pair of adjacent semiconductor mandrels;
    forming a fin on each of the sidewalls of the one of the pair of adjacent semiconductor mandrels;
    forming an occlusion layer on the fins and the one of the pair of adjacent semiconductor mandrels;
    removing another portion of the fill layer to expose the other of the pair of adjacent semiconductor mandrels; and
    forming another fin on each of the sidewalls of the other of the pair of adjacent semiconductor mandrels.

11. The method of claim 10, wherein the fins on the one of the pair of adjacent semiconductor mandrels are tensilely strained, and the fins on the other of the pair of adjacent semiconductor mandrels are compressively strained.

12. The method of claim 10, further comprising forming a second occlusion layer on the fins and the other of the pair of adjacent semiconductor mandrels.

13. The method of claim 12, further comprising removing the pair of adjacent semiconductor mandrels and semiconductor buffer pillars.

14. The method of claim 13, further comprising forming a dielectric plug in each of the spaces between the fins formed by removing the pair of adjacent semiconductor mandrels and semiconductor buffer pillars.

15. The method of claim 14, further comprising reducing the height of the dielectric plugs and occlusion layers to expose the fins and form a pedestal beneath each of the fins.

16. A tensilely strained n-type fin field effect transistor and compressively strained p-type fin field effect transistor on the same substrate, comprising:
    a semiconductor etch-stop layer on the substrate; and
    at least four fins on the semiconductor etch-stop layer, wherein a dielectric pedestal is between each of the at least four fins and the semiconductor etch-stop layer, and wherein at least two of the at least four fins is tensilely strained and at least two of the at least four fins is compressively strained.

17. The tensilely strained n-type fin field effect transistor and compressively strained p-type fin field effect transistor of claim 16, wherein the at least two tensilely strained fins are single crystal silicon (Si) and the at least two compressively strained fins are silicon-germanium (SiGe).

18. The tensilely strained n-type fin field effect transistor and compressively strained p-type fin field effect transistor of claim 17, wherein the semiconductor etch-stop layer is silicon-germanium (SiGe) with a germanium concentration in a range of about 20 atomic percent (at. %) to about 40 at. %.

19. The tensilely strained n-type fin field effect transistor and compressively strained p-type fin field effect transistor of claim 18, wherein the at least two compressively strained fins have a germanium concentration in a range of about 40 atomic percent (at. %) to about 60 at. %.

20. The tensilely strained n-type fin field effect transistor and compressively strained p-type fin field effect transistor of claim 19, wherein the at least two compressively strained fins are separated from the at least two tensilely strained fins by a distance in a range of about 40 nm to about 100 nm.

* * * * *